(12) United States Patent
Kurono

(10) Patent No.: US 7,373,184 B2
(45) Date of Patent: May 13, 2008

(54) PORTABLE RADIO COMMUNICATION APPARATUS AND CONNECTION MEMBER

(75) Inventor: Yuuhei Kurono, Hachioji (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 598 days.

(21) Appl. No.: 10/757,522

(22) Filed: Jan. 15, 2004

(65) Prior Publication Data

US 2004/0162120 A1 Aug. 19, 2004

(30) Foreign Application Priority Data

Feb. 19, 2003 (JP) ............................. 2003-040877

(51) Int. Cl.
*H04M 1/00* (2006.01)
(52) U.S. Cl. .............................. 455/575.1; 455/575.3; 455/90.3
(58) Field of Classification Search ............ 455/575.1, 455/90.3, 575.3; 379/433.13, 454
See application file for complete search history.

(56) References Cited

U.S. PATENT DOCUMENTS

| 6,600,662 | B1 * | 7/2003 | Emmert et al. ............. 361/814 |
| 2003/0096582 | A1 * | 5/2003 | Kim ............................. 455/90 |

FOREIGN PATENT DOCUMENTS

| JP | 59-140460 | 9/1984 | | |
| JP | 8-181404 | 7/1996 | | |
| JP | 8-321370 | 12/1996 | | |
| JP | 10-84406 | 3/1998 | | |
| JP | 2000-100506 | * | 4/2000 | ..................... 12/28 |
| JP | 2001-45123 | 2/2001 | | |
| JP | 2001-245032 | 9/2001 | | |
| JP | 2001-267696 | 9/2001 | | |
| JP | 2001-319713 | * | 11/2001 | ..................... 12/18 |
| JP | 2002-124779 | * | 4/2002 | ........................ 5/2 |
| JP | 2002-141620 | 5/2002 | | |

OTHER PUBLICATIONS

Notification of Reasons fro Rejection mailed on Mar. 31, 2006, from Japanese Patent Office in Japanese Patent Application No. 2003-040877.
Notification of Reasons for Rejection mailed on Feb. 9, 2007, from Japanese Patent Office in Japanese Patent Application No. 2003-40877.
Notification of Reasons for Rejection mailed on Feb. 9, 2007, from Japanese Patent Office in Japanese Patent Application No. 2006-320195.

(Continued)

*Primary Examiner*—Matthew Anderson
*Assistant Examiner*—Dominic E. Rego
(74) *Attorney, Agent, or Firm*—Finnegan, Henderson, Farabow, Garrett & Dunner, L.L.P.

(57) ABSTRACT

A portable radio communication apparatus includes a main body including an first housing, a second housing and a hinge foldably coupling the first and second housings, a first circuit board provided in the first housing, a second circuit board provided in the second housing, an electric part provided in the second housing independent from the second circuit board, and a connection member extending through the hinge and connected between the first and second circuit boards and having a branched portion connected at least one of the first and second circuit boards to the electric part.

8 Claims, 2 Drawing Sheets

OTHER PUBLICATIONS

Notification of Reasons for Rejection mailed on Jul. 6, 2007, from Japanese Patent Office in Japanese Patent Application No. 2003-40877 (4 pages).

Notification of Reasons for Rejection mailed on Jul. 6, 2007, from Japanese Patent Office in Japanese Patent Application No. 2006-320195 (4 pages).

Notification of Reasons for Rejection mailed Sep. 29, 2006, from Japenese Patent Office in Japenese Patent Application No. 2003-40877.

Notification of Reasons fro Rejection mailed on Mar. 31, 2006, from Japanese Patent Office in Japanese Patent Application No. 2003-040877.

* cited by examiner

PORTABLE RADIO COMMUNICATION APPARATUS AND CONNECTION MEMBER

CROSS-REFERENCE TO RELATED APPLICATIONS

This application is based upon and claims the benefit of priority from the prior Japanese Patent Application No. 2003-040877, filed Feb. 19, 2003, the entire contents of which are incorporated herein by reference.

BACKGROUND OF THE INVENTION

1. Field of the Invention

The present invention relates to a portable radio communication apparatus formed of two housings foldably connected to each other via a hinge, and to a connection member for use in connecting the two housings.

2. Description of the Related Art

A foldable type apparatus has been the mainstream of portable radio communication apparatuses. In this type, two housings (hereinafter referred to as an upper housing and a lower housing) are foldably connected or coupled to each other via a hinge. Each of the two housings contains a main circuit board (hereinafter referred to as an upper main circuit board or a lower main circuit board). The upper and lower main circuit boards are connected to each other via a flexible printed circuit board (hereinafter referred to as an FPC), which is passed through the hinge.

In addition to the upper and lower main circuit boards, another circuit board (hereinafter referred as a sub circuit board) may be contained in the upper or lower housing. In this case, the sub circuit board is connected to the upper or lower main circuit board via an FPC other than the aforementioned FPC or a cable. Therefore, one of the upper and lower main circuit boards needs to contain a connector for the FPC to be connected to the other main circuit board and a connector for the FPC or a cable to be connected to the sub circuit board.

Jpn. Pat. Appln. KOKAI Publication No. 2001-267696 discloses a flexible printed circuit board, one end of which is branched; that is, the FPC is Y shaped. The one end of the FPC is branched for the purpose of projecting two ends when the FPC is rolled. The two ends of the branched portions are connected to the same main circuit board.

Under the situations as described above, there is a demand for simply connecting two circuit boards respectively contained in the two housings and electric parts contained in either housing.

BRIEF SUMMARY OF THE INVENTION

An object of the present invention is to provide a foldable type portable radio communication apparatus having a simple connecting structure for connecting two circuit boards respectively contained in the two housings and electric parts contained in either housing.

According to an aspect of the invention, there is provided a portable radio communication apparatus comprising: a main body including an first housing, a second housing and a hinge foldably coupling the first and second housings; a first circuit board provided in the first housing; a second circuit board provided in the second housing;

an electric part provided in the second housing independent from the second circuit board; and a connection member extending through the hinge and connected between the first and second circuit boards and having a branched portion connected at least one of the first and second circuit boards to the electric part.

According to another aspect of the present invention, there is provided a connection member for use in a portable radio communication apparatus having a first housing configured to receive a first circuit board and a second housing configured to receive a second circuit board, an electric part and a hinge configured to couple the first and second housing and foldably supporting the first and second housing, the electric part being provided in the second housing independent from the second circuit board, the connection member comprising: a first connecting portion including a first conductor which electrically connects the first and second circuit boards; and a second connecting portion branched from the first connecting portion and including a second conductor which electrically connects at least one of the first and second circuit boards to the electric part.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

First Embodiment

A portable radio communication apparatus according to a first embodiment of the present invention will be described with reference to FIGS. 1 to 4.

Figure 1:
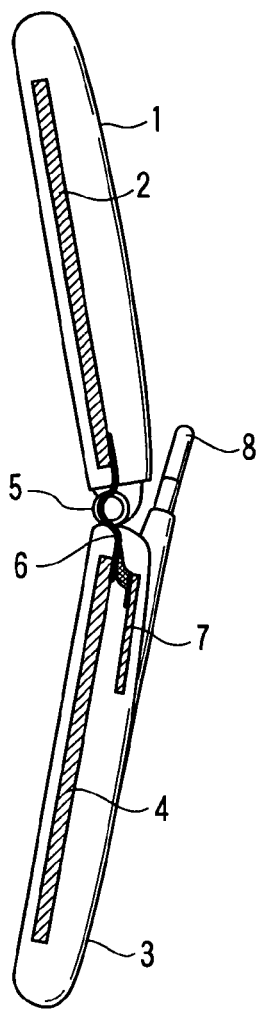
FIG. 1 is a side view schematically showing a structure of a portable radio communication apparatus according to a first embodiment of the present invention.

As shown in FIG. 1, the portable radio communication apparatus of the first embodiment has, as a main body, a structure formed of an upper housing 1 and a lower housing 3 coupled to each other via a hinge 5. The upper housing 1 contains an upper main circuit board 2. The lower housing 3 contains a lower main circuit board 4 and a sub circuit board 7 parallel to each other. Various electric parts to implement the functions of the portable radio communication apparatus are mounted on the upper and lower main circuit boards 2 and 4 and the sub circuit board 7. A flexible printed circuit board (FPC) 6 is arranged through the hinge 5. The FPC 6 electrically connects the upper and lower main circuit boards 2 and 4. It also electrically connects the sub circuit board 7 to the upper or lower main circuit board 2 or 4. An antenna 8 is used for radio communication.

Figure 2:
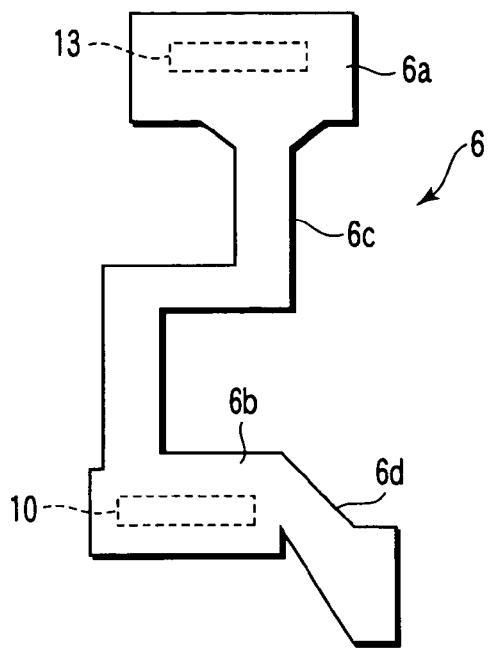
FIG. 2 is a developed view of a flexible printed circuit board shown in FIG. 1.

As shown in FIG. 2, the FPC 6 has connector mount portions 6a and 6b, a crank-shaped belt portion 6c and a branch portion 6d projected from the connector mount portion 6b. A plug 10 is mounted on the connector mount portion 6b. A plug 13 is mounted on the connector mount portion 6a. A conductive pattern (not shown) to be connected to the plug 10 or 13 is formed on the branch portion 6d. The conductive pattern formed on top end portion of the branch portion 6d (the right end in FIG. 2) is exposed, thus forming an FPC connector. A plug may also be mounted on the top end portion of the branch portion 6d. A conductive pattern is formed on the belt portion 6c to connect the plugs 10 and 13.

Figure 3:
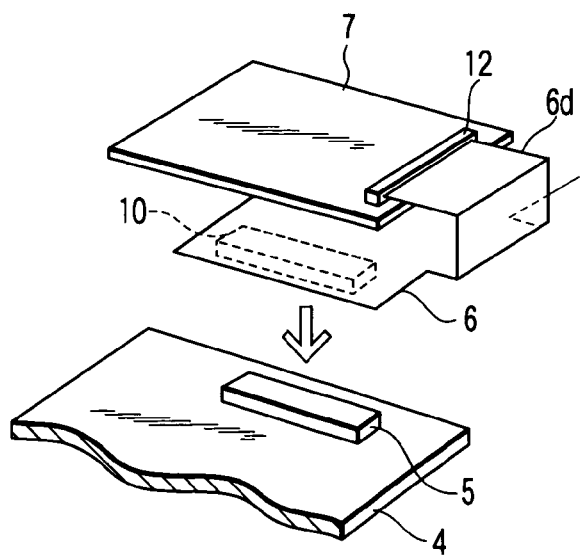
FIG. 3 is a perspective view showing how the circuit boards are connected in the lower housing shown in FIG. 1.

The FPC 6 is arranged, such that a central portion of the belt portion 6c is inserted through the hinge 5, with the result that the connector mount portion 6a is located in the upper housing 1, while the connector mount portion 6b and the branch portion 6d are located in the lower housing 2. The plug 10 is coupled to a jack 9 mounted on the lower main circuit board 4, as shown in FIG. 3. The branch portion 6d is bent as shown in FIG. 3, and the top end thereof is coupled to a jack 12 mounted on the sub circuit board 7. The plug 13 is coupled to a jack (not shown) mounted on the upper main circuit board 2 in the same manner as the plug 10.

Figure 4:
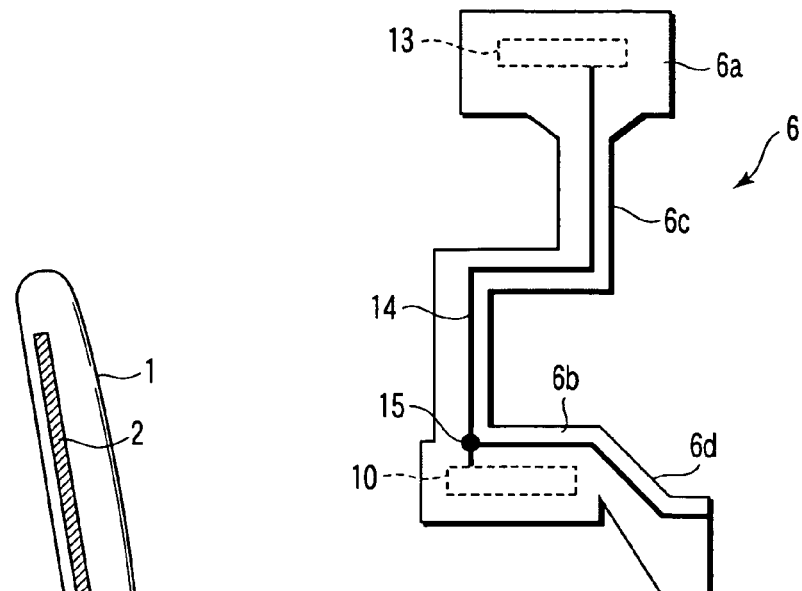
FIG. 4 is a plan view showing a shape of a common line pattern formed on the flexible printed circuit board shown in FIG. 1.

As shown in FIG. 4, a conductive pattern 14 formed on the FPC 6 connects the plug 10 and the plug 13. The conductive pattern 14 is branched at a branch point 15, and extends to a connection end of the branch portion 6d connected to the sub circuit board 7. The conductive pattern 14 is used as a line for use in common to the upper and lower main circuit boards 2 and 4 and the sub circuit board 7 (hereinafter referred to as a common line). For example, the common line corresponds to a power supply line, a grounded line or a clock signal transmitting line. A plurality of conductive patterns similar to the conductive pattern 14 may be provided to form a plurality of common lines.

As described above, according to the first embodiment, the upper and lower main circuit boards 2 and 4 and the sub circuit board 7 are connected only by the FPC 6. Therefore, each circuit board needs to have only one connector to be connected to the FPC 6. Consequently, it is unnecessary to branch a harness or to use a special connector shaped like, for example, a piggyback.

In addition, according to the first embodiment, since the conductive pattern 14 to be used as a common line is formed on the FPC 6, it is unnecessary to allot separate connector terminals to the same line in the plug 10 or 13. Therefore, the plug 10 or 13 can be compact.

As a result, according to the first embodiment, even if the sub circuit board 7 is provided in addition to the upper and lower main circuit boards 2 and 4, the circuit boards can be connected simply without increasing the number of connectors or terminals attached to each circuit board.

Second Embodiment

Figure 5:
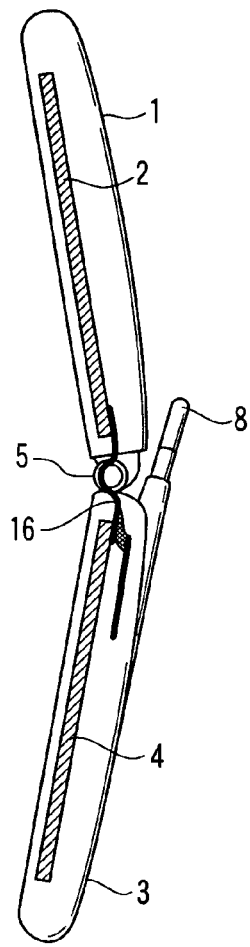
FIG. 5 is a side view schematically showing a structure of a portable radio communication apparatus according to a second embodiment of the present invention.
Figure 6:
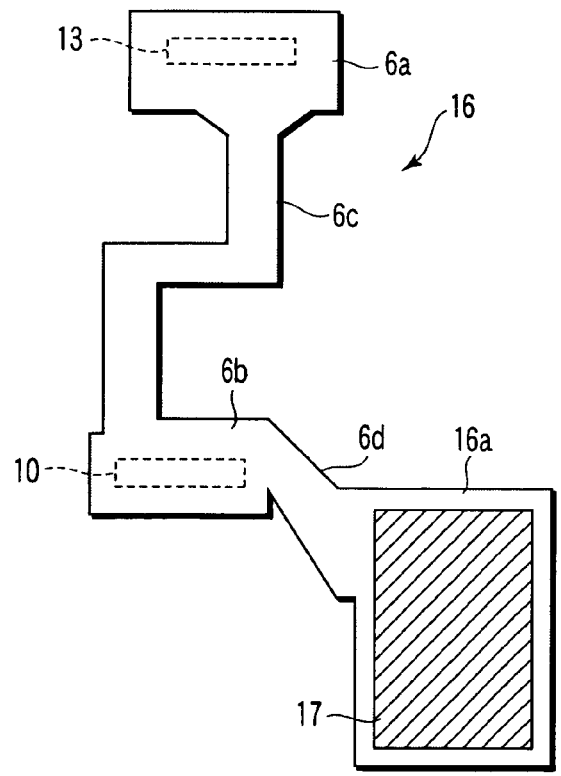
FIG. 6 is a developed view of a flexible printed circuit board shown in FIG. 5.

A portable radio communication apparatus according to a second embodiment of the present invention will be described with reference to FIGS. 5 and 6. In FIGS. 5 and 6, the same parts as those shown in FIGS. 1 and 2 are identified by the same reference numerals, and detailed descriptions thereof are omitted.

As shown in FIG. 5, the portable radio communication apparatus of the second embodiment has, as a main body, a structure formed of an upper housing 1 and a lower housing 3 connected to each other via a hinge 5. The upper housing 1 contains an upper main circuit board 2. The lower housing 3 contains a lower main circuit board 4. An FPC 16 is arranged through the hinge 5. The FPC 16 electrically connects the upper and lower main circuit boards 2 and 4. Various electric parts to implement the functions of the portable radio communication apparatus are mounted on the upper and lower main circuit boards 2 and 4 and the FPC 16. The electric parts mounted on the sub circuit board 7 in the first embodiment are directly mounted on the FPC 16. The FPC 16 electrically connects the electric parts to the upper or lower main circuit board 2 or 4.

As shown in FIG. 6, the FPC 16 additionally has a circuit mount portion 16a in a top end portion of the branch portion 6d of the FPC 6 of the first embodiment. The aforementioned electric parts are mounted on the circuit mount portion 16a. As a result, an electric circuit 17 similar to that mounted on the sub circuit board 7 is mounted on the circuit mount portion 16a. The conductive pattern formed on the branch portion 6d is connected to the electric circuit 17.

According to the second embodiment as described above, the following advantage can be obtained in addition to that of the first embodiment: the number of parts, such as connectors, can be less than that of the first embodiment. As a result, the mount efficiency can be further increased and the reliability of the portable radio communication apparatus is improved.

The above embodiments can be modified as described below.

In the first embodiment, the common line pattern such as the conductive pattern 14 may be omitted.

In the second embodiment, a common line pattern such as the conductive pattern 14 may be provided on the FPC 16.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A portable radio communication apparatus comprising:
    a main body including a first housing, a second housing and a hinge foldably coupling the first and second housings;
    a first circuit board provided in the first housing;
    a second circuit board provided in the second housing;
    an electric part provided in the second housing independent from the second circuit board; and
    a single-piece flexible connection member extending through the hinge and electrically connected between the first and second circuit boards and having a branched portion, as a part of the single-piece connection member, electrically connected at least one of the first and second circuit boards to the electric part.

2. The portable radio communication apparatus according to claim 1, further comprising a third circuit board configured to mount the electric part thereon.

3. The portable radio communication apparatus according to claim 2, wherein the third circuit board is arranged substantially parallel to the second circuit board.

4. The portable radio communication apparatus according to claim 1, wherein the connection member includes a conductor electrically connected to the first and second circuit boards and the electric part which serves as one of a power supply line, a grounded line and a signal line.

5. The portable radio communication apparatus according to claim 1, wherein the electric part is mounted on the branched portion of the connection member.

6. A single-piece flexible connection member for use in a portable radio communication apparatus having a first housing configured to receive a first circuit board and a second housing configured to receive a second circuit board, an electric part and a hinge configured to couple the first and second housing and foldably supporting the first and second housing, the electric part being provided in the second housing independent from the second circuit board, the single-piece flexible connection member comprising:

a first connecting portion including a first conductor which electrically connects the first and second circuit boards;

a second connecting portion branched from the first connecting portion and including a second conductor which electrically connects at least one of the first and second circuit boards to the electric part; and a plurality of conductive patterns for use in common to the first and second circuit boards and the electric part.

7. The connection member according to claim 6, further comprising a third conductor which is electrically connected to the first and second circuit boards and the electric part which serves as one of a power supply line, a grounded line or a signal line.

8. The connection member according to claim 6, wherein the second connecting portion has a mount surface on which the electric part is to be mounted.

* * * * *

UNITED STATES PATENT AND TRADEMARK OFFICE
CERTIFICATE OF CORRECTION

PATENT NO. : 7,373,184 B2
APPLICATION NO. : 10/757522
DATED : May 30, 2008
INVENTOR(S) : Kurono It is certified that error appears in the above-identified patent and that said Letters Patent is hereby corrected as shown below:

On the cover page,

[*] Notice: Subject to any disclaimer, the term of this patent is extended or adjusted under 35 USC 154(b) by 598 days Delete the phrase "by 598 days" and insert -- by 544 days --

Signed and Sealed this

Fourth Day of November, 2008

JON W. DUDAS
*Director of the United States Patent and Trademark Office*

UNITED STATES PATENT AND TRADEMARK OFFICE
CERTIFICATE OF CORRECTION

PATENT NO.        : 7,373,184 B2                                Page 1 of 1
APPLICATION NO.   : 10/757522
DATED             : May 13, 2008
INVENTOR(S)       : Kurono It is certified that error appears in the above-identified patent and that said Letters Patent is hereby corrected as shown below:

On the cover page,

[*] Notice:    Subject to any disclaimer, the term of this patent is extended or adjusted under 35 USC 154(b) by 598 days Delete the phrase "by 598 days" and insert -- by 544 days --

This certificate supersedes the Certificate of Correction issued November 4, 2008.

Signed and Sealed this

Twenty-fifth Day of November, 2008

JON W. DUDAS
*Director of the United States Patent and Trademark Office*